(12) United States Patent
Fukushi

(10) Patent No.: US 9,360,773 B2
(45) Date of Patent: Jun. 7, 2016

(54) MARK DETECTING METHOD

(71) Applicant: DISCO CORPORATION, Tokyo (JP)

(72) Inventor: Nobuyuki Fukushi, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/577,427

(22) Filed: Dec. 19, 2014

(65) Prior Publication Data

US 2015/0198899 A1   Jul. 16, 2015

(30) Foreign Application Priority Data

Jan. 10, 2014   (JP) ................................. 2014-003081

(51) Int. Cl.
   *G03B 27/58*   (2006.01)
   *G03B 27/60*   (2006.01)
   *G03F 7/20*   (2006.01)
   *H01L 21/68*   (2006.01)

(52) U.S. Cl.
   CPC .......... *G03F 7/70775* (2013.01); *H01L 21/681* (2013.01)

(58) Field of Classification Search
   CPC .................................................. G03F 7/70775
   USPC ...................................................... 355/72–77
   See application file for complete search history.

(56) References Cited

U.S. PATENT DOCUMENTS

| | | | | |
|---|---|---|---|---|
| 6,225,012 B1* | 5/2001 | Nishi | .................. | G03F 7/70691 430/22 |
| 2010/0033706 A1* | 2/2010 | Shindo | .............. | H01L 21/67259 355/74 |
| 2010/0054901 A1* | 3/2010 | Lin | ........................ | H01L 21/681 414/590 |
| 2010/0075442 A1 | 3/2010 | Hayashi et al. | | |

FOREIGN PATENT DOCUMENTS

| | | |
|---|---|---|
| JP | 11-317439 | 11/1999 |
| JP | 2011-040637 | 2/2011 |
| JP | 2011-40637 | 2/2011 |

OTHER PUBLICATIONS

United Kingdom Search Report issued in GB 1500083.9, dated May 29, 2015.

* cited by examiner

*Primary Examiner* — Hung Henry Nguyen
(74) *Attorney, Agent, or Firm* — Greer Burns & Crain Ltd.

(57) ABSTRACT

A mark detecting method of detecting a notch as a mark formed on the outer circumference of a wafer held on a holding table. The mark detecting method includes the steps of index-rotating the holding table to image at least three points on the outer circumference of the wafer and to thereby detect the coordinates at the three points on the outer circumference of the wafer, calculating the center of the wafer from the coordinates at the three points, centering the wafer with respect to the holding table, and continuously rotating the holding table through 360° to image the whole of the outer circumference of the wafer by using a minimum imaging area corresponding to the outer circumference of the wafer and to thereby detect the angle where the notch is located.

3 Claims, 6 Drawing Sheets

MARK DETECTING METHOD

BACKGROUND OF THE INVENTION

1. Field of the Invention

The present invention relates to a mark detecting method of detecting a mark for indicating a crystal orientation as formed on the outer circumference of a wafer such as a semiconductor wafer, and more particularly to a mark detecting method of detecting a mark of a large-size wafer having a diameter of 450 mm.

2. Description of the Related Art

Usually, a mark for indicating a crystal orientation is formed on the outer circumference of a wafer, and a wafer processing direction as in a cutting apparatus is decided in consideration of the crystal orientation indicated by the mark. As a conventional mark detecting method of detecting such a mark, there is a method of simultaneously detecting the center of a wafer and the mark for indicating the crystal orientation of the wafer by imaging the outer circumference of the wafer (see Japanese Patent Laid-open No. 2011-40637, for example). In the mark detecting method described in Japanese Patent Laid-open No. 2011-40637, the whole of the outer circumference of the wafer held on a holding table is imaged by an imaging apparatus. Thereafter, the center of the wafer is calculated from the image obtained by the imaging apparatus, and the mark is detected from a change in position on the outer circumference of the wafer.

SUMMARY OF THE INVENTION

In the mark detecting method described in Japanese Patent Laid-open No. 2011-40637, the amount of deviation of the center of the wafer and the mark can be detected during 360° rotation of the wafer. However, in consideration of the deviation of the center of the wafer from the center of the holding table, an imaging area by the imaging apparatus must be set to a large area, so that the pixel density in the imaging area becomes small, and a sufficient detection accuracy cannot therefore be obtained. In this case, the detection accuracy can be improved by increasing the number of pixels. However, the data volume is increased and much time is therefore required to read the data. Accordingly, the rotational speed of the holding table must be reduced according to the read speed for the data, causing a problem that much time is required for the detection of the mark.

It is therefore an object of the present invention to provide a mark detecting method which can detect the mark for indicating the crystal orientation of a wafer accurately in a short time.

In accordance with an aspect of the present invention, there is provided a mark detecting method for a wafer using a processing apparatus including a holding table having a suction holding surface for holding a central portion of a disk-shaped wafer under suction, the suction holding surface having an area smaller than that of the wafer, the wafer having a mark for indicating a crystal orientation on the outer circumference of the wafer, rotating means for rotating the holding table about its center as an axis of rotation at at least two speeds including a high speed and a low speed, an angle specifying section for specifying the rotational angle of the holding table to be rotated by the rotating means, an angle detecting section for detecting the rotational angle of the holding table rotated by the rotating means, imaging means for imaging the outer circumference of the wafer during the rotation of the holding table by the rotating means, a coordinate storing section for storing the coordinate at a specified position on the outer circumference of the wafer in an image obtained by the imaging means at the rotational angle detected by the angle detecting section, and suction holding position changing means for changing a suction holding position of the wafer to be held under suction on the holding table, the mark detecting method including an outer circumference coordinate storing step of index-rotating the holding table at the high speed by operating the rotating means through the rotational angle specified by the angle specifying section, imaging at least three points on the outer circumference of the wafer by operating the imaging means, and storing the coordinates at the three points on the outer circumference of the wafer into the coordinate storing section; a center calculating step of calculating the center of the wafer by using the coordinates at the three points stored in the outer circumference coordinate storing step; a wafer centering step of making the center of the wafer calculated in the center calculating step coincide with the center of the holding table preliminarily stored, by using the suction holding position changing means; and a mark detecting step of continuously rotating the holding table holding under suction the wafer centered in the wafer centering step at the low speed by operating the rotating means, imaging the whole of the outer circumference of the wafer during the rotation of the holding table by using limited pixels in the image obtained by the imaging means along the outer circumference of the wafer, and detecting the rotational angle where the mark is located.

With this configuration, the holding table is first index-rotated at a high speed to image at least three points on the outer circumference of the wafer by using the imaging means, thereby obtaining the coordinates at the three points on the outer circumference of the wafer. Thereafter, the center of the wafer is calculated from the coordinates at the three points on the outer circumference of the wafer. Thereafter, the center of the wafer is performed so that the center of the wafer is made to coincide with the center of the holding table. By performing the centering of the wafer, the fluctuations of the outer circumference of the wafer in rotating the holding table can be reduced, so that the imaging area by the imaging means can be minimized in imaging the whole of the outer circumference of the wafer to detect the mark on the outer circumference of the wafer. In this manner, the holding table is index-rotated at a high speed in performing the centering of the wafer, so that the centering of the wafer can be performed in a short time. Further, since the imaging area in detecting the mark on the outer circumference of the wafer can be minimized, there is no possibility that the data volume may become excessively large even when the number of pixels is increased. Accordingly, the read time for the data can be reduced to thereby increase the rotational speed of the holding table, so that the mark can be detected accurately in a short time.

Preferably, the center calculating step includes a first calculating step of index-rotating the holding table through the rotational angle specified by the angle specifying section, imaging the three points on the outer circumference of the wafer by using the imaging means, and calculating the center of the wafer from the images obtained by the imaging means; a second calculating step of replacing at least one of the images obtained at the three points with another image and then calculating the center of the wafer from the images different in combination from those used in the first calculating step; and a determining step of comparing the center calculated in the first calculating step with the center calculated in the second calculating step and then determining that the center has been calculated if the two centers calculated coincide with each other; wherein the second calculating step is repeated until it is determined that the center has been calculated in the determining step, thus calculating the center of the wafer by using at least four images obtained by the imaging means.

Preferably, the suction holding position changing means includes a mounting table for mounting a peripheral portion of the wafer projecting outward from the suction holding surface of the holding table, elevating means for relatively moving the mounting table and the holding table in a vertical direction, and moving means for relatively moving the mounting table and the holding table in a horizontal direction; the wafer centering step using the suction holding position changing means including a placing step of setting the upper surface of the mounting table to a position higher than the suction holding surface of the holding table by operating the elevating means, thereby placing the wafer on the mounting table; a moving step of moving the holding table by operating the moving means after performing the placing step; and a holding step of setting the upper surface of the mounting table to a position lower than the suction holding surface of the holding table by operating the elevating means after performing the moving step, thereby holding the wafer on the holding table under suction.

According to the present invention, the mark on the outer circumference of the wafer is detected after centering the wafer, so that the imaging area can be minimized in detecting the mark on the outer circumference of the wafer. Accordingly, even when the number of pixels is increased, the data volume does not become excessively large. As a result, the data can be read in a short time and the rotational speed of the holding table can therefore be increased. Accordingly, the mark for indicating the crystal orientation of the wafer can be detected accurately in a short time.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
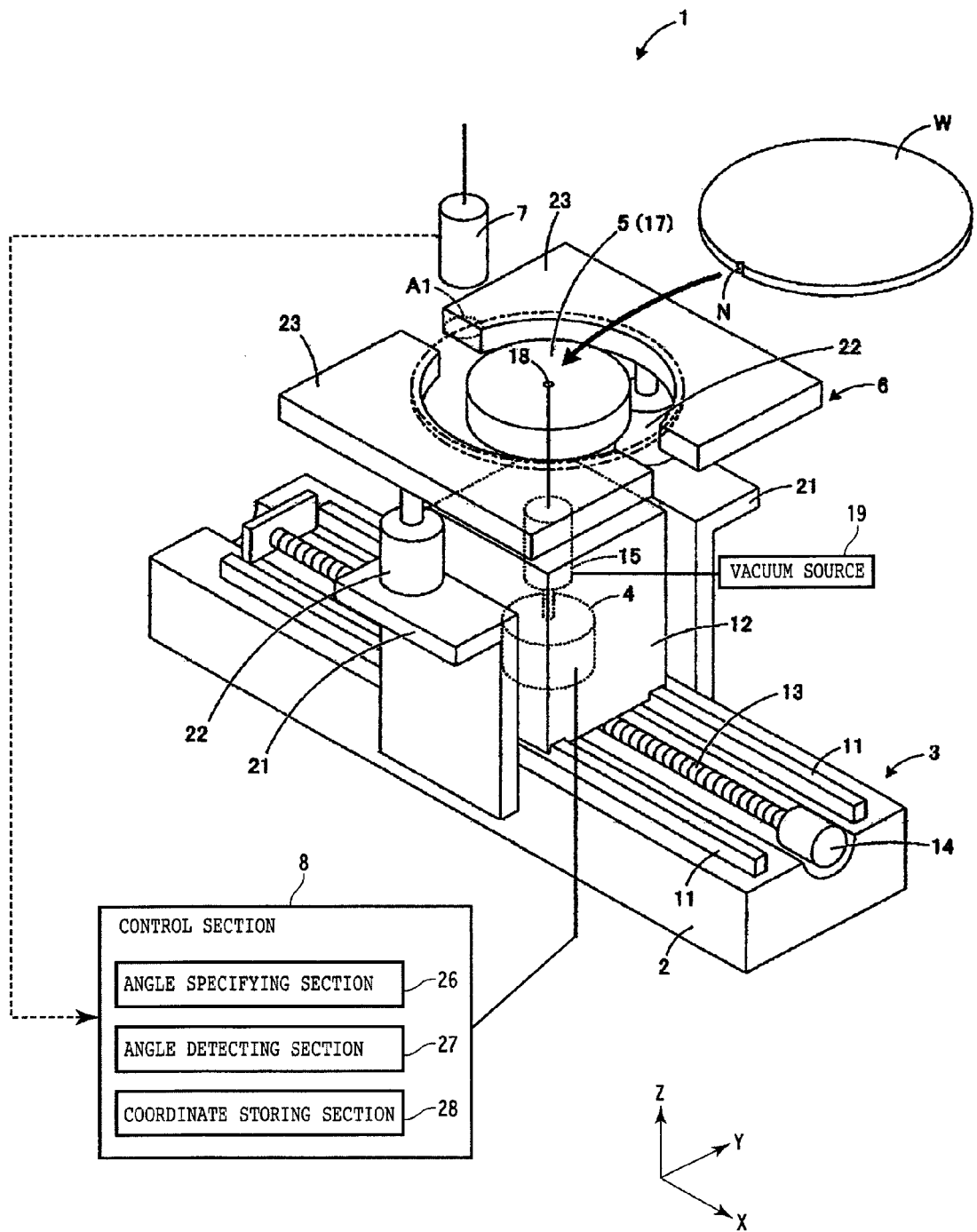
FIG. 1 is a perspective view of a mark detecting apparatus for use in a mark detecting method according to a preferred embodiment of the present invention.

There will now be described a mark detecting apparatus for use in a mark detecting method according to a preferred embodiment of the present invention. FIG. 1 is a perspective view of a mark detecting apparatus 1 according to this preferred embodiment. The configuration of the mark detecting apparatus 1 shown in FIG. 1 is merely illustrative and may be suitably modified. As shown in FIG. 1, the mark detecting apparatus 1 includes a rotatable holding table 5 for holding a wafer W and imaging means 7 for imaging the outer circumference of the wafer W held on the holding table 5 in the condition where the holding table 5 is rotated. In the case that the holding table 5 is index-rotated (intermittently rotated) at a high speed to image several points on the outer circumference of the wafer W, the wafer W is centered with respect to the holding table 5 (wafer centering). Further, in the case that the holding table 5 is continuously rotated at a low speed to image the whole of the outer circumference of the wafer W, a notch N as a mark for indicating the crystal orientation of the wafer W is detected (mark detection).

While the notch N formed on the outer circumference of the wafer W is detected as the mark for indicating the crystal orientation in this preferred embodiment, the mark for indicating the crystal orientation is not limited to the notch N in the present invention provided that the mark is formed on the outer circumference of the wafer W. For example, the mark may be an orientation flat formed by linearly cutting away the outer circumference of the wafer W. Further, the wafer W may be a semiconductor wafer formed of silicon, gallium arsenide, etc. or may be an optical device wafer formed of ceramic, glass, sapphire, etc. Further, the mark detecting apparatus 1 may be mounted in a processing apparatus such as a grinding apparatus and a cutting apparatus or may be used as an apparatus dedicated to mark detection.

The mark detecting apparatus 1 includes a fixed base 2 and moving means 3 provided on the fixed base 2 for moving the wafer W held on the holding table 5 in the X direction. The moving means 3 includes a pair of parallel guide rails 11 provided on the fixed base 2 so as to extend in the X direction and a motor-driven movable base 12 slidably mounted on the pair of guide rails 11. The lower surface of the movable base 12 is formed with a nut portion (not shown), and a ball screw 13 is threadedly engaged with this nut portion of the movable base 12. A driving motor 14 is connected to one end of the ball screw 13. Accordingly, when the ball screw 13 is rotationally driven by the driving motor 14, the movable base 12 is moved along the guide rails 11.

The holding table 5 is a disk-shaped member having a diameter smaller than that of the wafer W. The holding table 5 is rotatably supported to the movable base 12. Rotating means 4 such as a motor is accommodated in the movable base 12, and the holding table 5 is connected through a rotary joint 15 to the rotating means 4. The rotating means 4 is configured so that the rotational speed of the holding table 5 can be changed between two speeds, i.e., a high speed where index rotation is performed and a low speed where continuous rotation is performed. The holding table 5 has an upper surface 17 as a suction holding surface having an area smaller than that of the wafer W on each side thereof. The upper surface 17 of the holding table 5 is formed with a central suction hole 18 for holding the center of the wafer W under suction. The suction hole 18 is connected through the rotary joint 15 provided in the movable base 12 to a vacuum source 19.

A pair of support plates 21 are provided on the opposite sides of the movable base 12 in spaced relationship thereto. Elevating means 22 such as a cylinder is mounted on each support plate 21. A pair of mounting tables 23 are respectively supported to the upper ends of the pair of elevating means 22 so as to surround the holding table 5. A peripheral area of the wafer W held on the upper surface 17 of the holding table 5 is not in contact with the upper surface 17 (i.e., the peripheral area of the wafer W projects outward from the upper surface 17), and this peripheral area is adapted to be mounted on the pair of mounting tables 23. By lowering the pair of mounting tables 23, the wafer W is transferred from the mounting tables 23 to the holding table 5, whereas by raising the pair of mounting tables 23, the wafer W is transferred from the holding table 5 to the mounting tables 23.

The moving means 3, the mounting tables 23, and the elevating means 22 constitute suction holding position changing means 6 for changing the suction holding position of the wafer W on the holding table 5. In the condition where the wafer W has been transferred from the holding table 5 to the pair of mounting tables 23 by the suction holding position changing means 6, a deviation of the center of the wafer W from the center of the holding table 5 is corrected by the suction holding position changing means 6. Thereafter, the wafer W is transferred again from the pair of mounting tables 23 to the holding table 5, thereby making the center of the wafer W coincide with the center of the holding table 5, i.e., performing the centering of the wafer W.

The imaging means 7 for imaging the outer circumference of the wafer W is located above the holding table 5. In the case of centering the wafer W, at least three points on the outer circumference of the wafer W are imaged by the imaging means 7 in the condition where the holding table 5 is index-rotated at a high speed. In the case of detecting the notch N after centering the wafer W, the whole of the outer circumference of the wafer W is imaged by the imaging means 7 in the condition where the holding table 5 is continuously rotated 360° at a low speed. The imaging means 7 is connected to a control section 8 which will be hereinafter described. Both in centering the wafer W and in detecting the notch N, the imaging means 7 outputs images of the outer circumference of the wafer W to the control section 8.

Connected to the control section 8 are an angle specifying section 26 for specifying the rotational angle of the holding table 5 to be rotated by the rotating means 4 and an angle detecting section 27 for detecting the rotational angle of the holding table 5 rotated by the rotating means 4. In centering the wafer W, the holding table 5 is index-rotated through the rotational angle specified by the angle specifying section 26, and the outer circumference of the wafer W is imaged at the rotational angle detected by the angle detecting section 27. In centering the wafer W, the outer circumference of the wafer W is imaged at at least three positions, which may be equally spaced or may be unequally spaced. That is, at least three rotational angles to be specified may be equally spaced or may be unequally spaced.

The control section 8 centrally controls the components of the apparatus 1 according to the inputs from the imaging means 7, the angle specifying section 26, and the angle detecting section 27. The control section 8 is constituted of a processor, memory, etc. for performing various steps of the mark detecting method. The memory is composed of one or more storage media such as ROM (Read Only Memory) and RAM (Random Access Memory) according to uses. The memory includes a coordinate storing section 28 for storing the coordinates of the specified positions on the outer circumference of the wafer W imaged by the imaging means 7. Further, the memory preliminarily stores a program for centering the wafer W and a program for detecting the notch N of the wafer W.

Figure 2A:
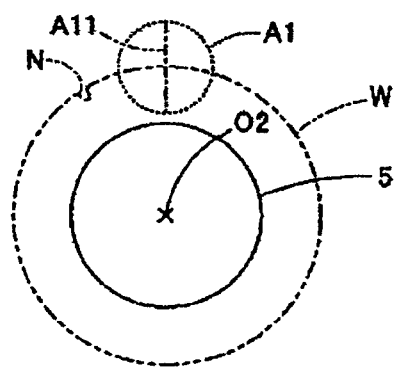
FIGS. 2A to 2D are plan views for illustrating the mark detecting method according to this preferred embodiment.
Figure 2B:
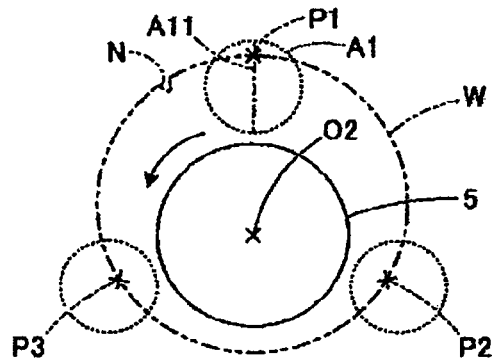

The mark detecting method according to this preferred embodiment will now be described in comparison with the prior art with reference to FIGS. 2A to 4C. FIGS. 2A to 2D are plan views for illustrating the mark detecting method according to this preferred embodiment. FIGS. 3A to 3D are plan views for illustrating a mark detecting method according to a first comparison. FIGS. 4A to 4C are plan views for illustrating a mark detecting method according to a second comparison. The mark detecting method according to the first comparison is different from the mark detecting method according to this preferred embodiment in the point that an optical sensor is used. The mark detecting method according to the second comparison is different from the mark detecting method according to this preferred embodiment in the point that the amount of deviation of the center of a wafer and the mark of the wafer are simultaneously detected. Accordingly, the first and second comparisons will be described mainly on these different points.

The mark detecting method according to this preferred embodiment will now be described. In this preferred embodiment, the center of the wafer W is calculated to perform the centering, and the notch N is next detected from the outer circumference of the wafer W. As shown in FIG. 2A, an imaging area A1 by the imaging means 7 (see FIG. 1) is positioned on the outer circumference of the wafer W, and an image obtained in the imaging area A1 is used to perform the centering of the wafer W and the detection of the notch N. In calculating the center of the wafer W before centering the wafer W, a linear area A11 passing through the center of the wafer W is preset in the imaging area A1. FIG. 2B shows a condition where the wafer W is deviated in position from the holding table 5.

First, an outer circumference coordinate storing step is performed in the condition where the wafer W is deviated in position from the holding table 5 as shown in FIG. 2B. In the outer circumference coordinate storing step, the holding table 5 is index-rotated at a high speed through the angle specified by the angle specifying section 26 (see FIG. 1). Thereafter, at least three points on the outer circumference of the wafer W are imaged by the imaging means 7. Thereafter, coordinates P1, P2, and P3 at the three points on the outer circumference of the wafer W are stored into the coordinate storing section 28 (see FIG. 1). In this case, the coordinate at the intersection between the linear imaging area A11 and the outer circumference of the wafer W is stored into the coordinate storing section 28.

Figure 2C:
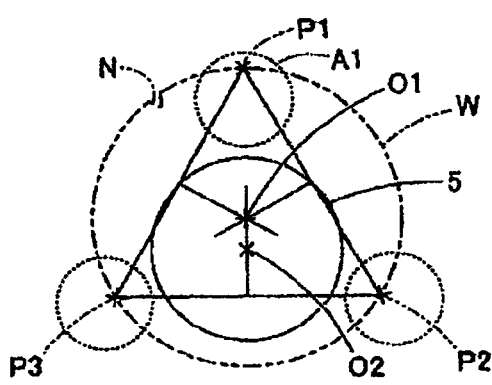
Figure 3A:
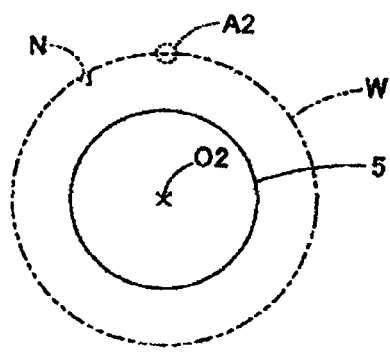
FIGS. 3A to 3D are plan views for illustrating a mark detecting method according to a first comparison.
Figure 3B:
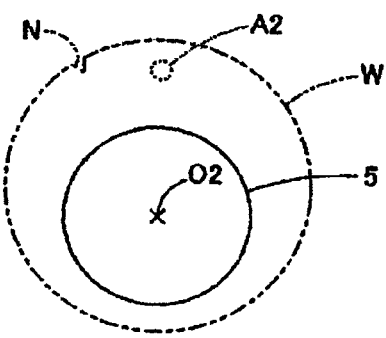
Figure 3C:
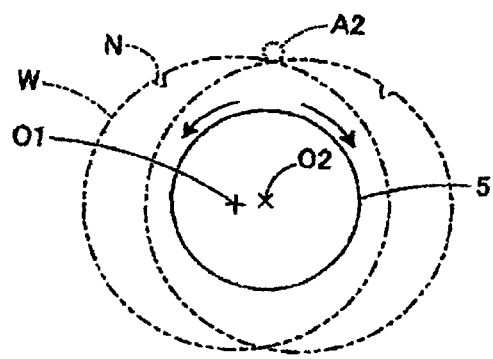

Thereafter, a center calculating step is performed as shown in FIG. 2C. In the center calculating step, the coordinates P1 to P3 at the three points on the outer circumference of the wafer W are used to calculate the center O1 of the wafer W. For example, a chord is drawn by connecting any two of the three points on the outer circumference of the wafer W, and the perpendicular bisector of this chord is drawn. Thereafter, the intersection between the perpendicular bisector of this chord and the perpendicular bisector of another chord is obtained to thereby calculate the center O1 of the wafer W. After performing the center calculating step mentioned above, a wafer centering step is performed. In the wafer centering step, the suction holding position changing means 6 (see FIG. 1) is operated to make the center O1 of the wafer W coincide with the center O2 of the holding table 5, the center O2 being preliminarily stored. In this case, the direction and amount of deviation of the center O1 of the wafer W from the center O2 of the holding table 5 are obtained and the suction holding position changing means 6 is controlled according to the direction and amount of deviation obtained above. This wafer centering step will be hereinafter described in more detail.

Figure 2D:
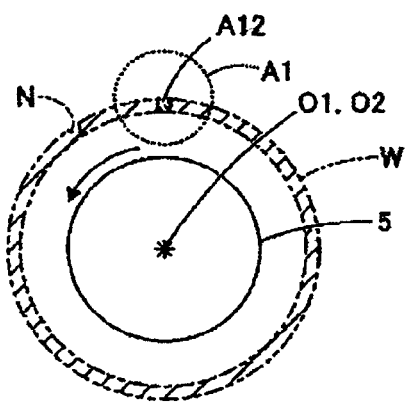

After performing the wafer centering step, a mark detecting step is performed as shown in FIG. 2D. In the mark detecting step, the holding table 5 is rotated 360° at a low speed in the condition where the wafer W is centered with respect to the holding table 5. During this rotation, the whole of the outer circumference of the wafer W is imaged to detect the angle where the notch N of the wafer W is located. In this case, fluctuations of the outer circumference of the wafer W are small during the rotation of the holding table 5. Accordingly, limited pixels in the image along the outer circumference of the wafer W are used, that is, a part A12 of the imaging area A1 is used to image the outer circumference of the wafer W. Accordingly, the imaging area A12 by the imaging means 7 can be minimized, so that even when the number of pixels is increased, there is no possibility that the data volume may become excessively large.

In this manner, the holding table 5 is index-rotated at a high speed in the mark detecting method according to this preferred embodiment, so that the centering of the wafer W with respect to the holding table 5 can be performed in a short time. Further, since the imaging area A12 in detecting the mark can be minimized, the data volume of the image does not become excessively large even when the number of pixels of the image is increased. Further, although the holding table 5 is rotated at a low speed in detecting the mark, the read time for the data of the image can be reduced and the rotational speed of the holding table 5 can therefore be increased. Accordingly, the notch N can be detected from the outer circumference of the wafer W accurately in a short time.

The mark detecting method according to the first comparison will now be described. In the first comparison, the center of the wafer W is calculated to center the wafer W and the notch N is next detected from the outer circumference of the wafer W. However, the first comparison is different from this preferred embodiment in the point that an optical sensor is used in place of the imaging means 7. As shown in FIG. 3A, a recognizing area A2 by the optical sensor is positioned on the outer circumference of the wafer W, and the notch N on the outer circumference of the wafer W is detected from a change in light quantity in the recognizing area A2. FIG. 3B shows a condition where the wafer W is deviated in position from the holding table 5.

First, the center of the wafer W is calculated in the condition where the wafer W is deviated in position from the holding table 5 as shown in FIG. 3B. In calculating the center of the wafer W, the holding table 5 is rotated in one direction until the wafer W comes out of the recognizing area A2, and the rotational angle of the holding table 5 at this time is stored as shown in FIG. 3C. Similarly, the holding table 5 is rotated in the other direction until the wafer W comes out of the recognizing area A2 again, and the rotational angle of the holding table 5 at this time is also stored as shown in FIG. 3C. Thereafter, the center O1 of the wafer W is calculated according to these rotational angles and the external size of the wafer W, thereby obtaining the direction and amount of deviation of the wafer W from the holding table 5. Thereafter, the center O1 of the wafer W is made to coincide with the center O2 of the holding table 5, thus centering the wafer W.

Figure 3D:
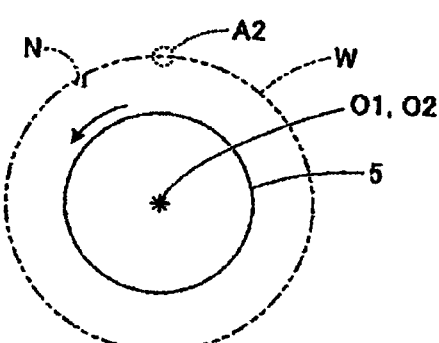
Figure 4A:
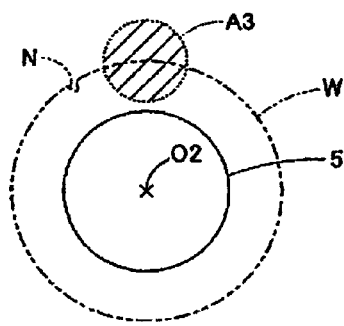
FIGS. 4A to 4C are plan views for illustrating a mark detecting method according to a second comparison.
Figure 4B:
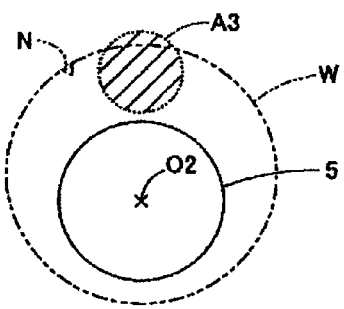
Figure 4C:
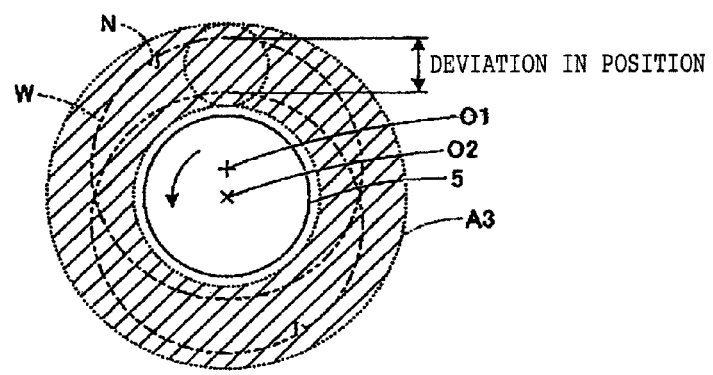

After correcting the deviation of the wafer W from the holding table 5 as mentioned above, the holding table 5 is rotated 360° at a low speed so that the whole of the outer circumference of the wafer W passes through the recognizing area A2 as shown in FIG. 3D. Accordingly, the angle where the notch N on the outer circumference of the wafer W is located is detected according to a change in light quantity detected by the optical sensor. In this manner, the first comparison includes the center calculating step, the wafer centering step, and the mark detecting step as similar to this preferred embodiment. However, the rotational speed of the holding table 5 cannot be increased because the shape of the outer circumference of the wafer W is recognized by the optical sensor. In particular, index rotation cannot be performed in the first comparison, so that much time is required for the centering of the wafer W. As a result, the detection of the notch N from the outer circumference of the wafer W in the mark detecting method according to the first comparison is slower in speed than that in the mark detecting method according to this preferred embodiment.

The mark detecting method according to the second comparison will now be described. In the second comparison, the imaging means 7 is used as similar to this preferred embodiment. However, the second comparison is different from this preferred embodiment in the point that the amount of deviation of the center of the wafer W and the notch N of the wafer W are simultaneously detected. As shown in FIG. 4A, an imaging area A3 by the imaging means 7 is positioned on the outer circumference of the wafer W, and the image obtained in the imaging area A3 is used to detect the notch N on the outer circumference of the wafer W. In the second comparison, the notch N of the wafer W is detected without centering the wafer W. Accordingly, the imaging area A3 is preset to a large area in consideration of the fluctuations of the outer circumference of the wafer W in rotating the holding table 5. FIG. 4B shows a condition where the wafer W is deviated in position from the holding table 5.

First, in the condition where the wafer W is deviated in position from the holding table 5 as shown in FIG. 4B, the holding table 5 is rotated 360° at a low speed to image the whole of the outer circumference of the wafer W. Thereafter, as shown in FIG. 4C, the center O1 of the wafer W is calculated according to the image obtained, and the direction and amount of deviation of the center O1 of the wafer W from the center O2 of the holding table 5 are next obtained. At the same time, the notch N on the outer circumference of the wafer W is also detected according to the image obtained. In the second comparison, the whole of the outer circumference of the wafer W is imaged in the large imaging area A3, so that the data volume of the image obtained is larger than that in the mark detecting method according to this preferred embodiment.

Accordingly, the rotational speed of the holding table 5 must be reduced according to the read speed for the data. Further, since the imaging area A3 is large, the pixel density becomes small, so that a sufficient detection accuracy cannot be obtained. In this case, the detection accuracy can be improved by increasing the number of pixels. However, the data volume is further increased, so that much time is required for the detection of the notch N. In particular, a large-size wafer W having a diameter of 450 mm has recently been developed. Accordingly, in the case of using such a large-size wafer W, it is assumed that the detection time for the notch N may become longer. Thus in the second comparison, the detection speed for the notch N on the outer circumference of the wafer W is lower than that in this preferred embodiment.

As described above, the mark detecting method according to this preferred embodiment can detect the notch N accurately in a short time. The center calculating step in this preferred embodiment is a one-step operation of calculating the center of the wafer W. However, when the notch N is included in one of the images at the three points on the outer circumference of the wafer W, there is a case that the center of the wafer W cannot be accurately calculated. To cope with this case, the calculation may be performed plural times to calculate the center of the wafer W, thereby improving the calculation accuracy.

In this case, a first calculating step is performed in such a manner that the center (the coordinate at the center) of the wafer W is calculated from the images at the three points on the outer circumference of the wafer W. In the first calculating step, the holding table 5 is index-rotated through the angle specified by the angle specifying section 26 (see FIG. 1) to image the three points on the outer circumference of the wafer W. Thereafter, a second calculating step is performed in such a manner that the center (the coordinate at the center) of the wafer W is calculated from the images at other three points on the outer circumference of the wafer W different from the three points used in the first calculating step. In the second calculating step, at least one of the images at the three points used in the first calculating step is replaced by another image to use the combination of the images different from that used in the first calculating step.

Thereafter, a determining step is performed in such a manner that the centers calculated in the first and second calculating steps are compared with each other and it is determined that the center has been calculated if the two centers coincide with each other. If the two centers calculated in the first and second calculating steps do not coincide with each other, it is determined that the notch N is included in any one of the images obtained and that the center of the wafer W has not been calculated. In this case, the second calculating step is repeated until it is determined that the center of the wafer W has been calculated in the determining step. In this manner, the center of the wafer W is calculated by using at least four images in consideration of the possibility that the notch N may be imaged.

The determination that the centers coincide with each other in the determining step is not limited to that in the case that the centers completely coincide with each other. That is, the centers calculated in the first and second calculating steps may be deviated to such an extent that the deviation falls within a predetermined tolerance. In this case, the tolerance is preferably set so that the fluctuations of the outer circumference of the wafer W in rotating the holding table 5 after centering the wafer W are included in the minimum imaging area.

There will now be described with reference to FIGS. 5A to 5C the center calculating step of calculating the center of the wafer W by repeating the calculation. In the first calculation shown in FIG. 5A, the holding table 5 is index-rotated at equal intervals to image three points equally spaced on the outer circumference of the wafer W by the use of the imaging means 7 (see FIG. 1). In this case, coordinates P11, P12, and P13 at the three points on the outer circumference of the wafer W are detected from the images at the three points, wherein the notch N is detected as the coordinate P11. A chord is drawn by connecting any two of the three points on the outer circumference of the wafer W, and the perpendicular bisector of this chord is drawn. Thereafter, the intersection between the perpendicular bisector of this chord and the perpendicular bisector of another chord is obtained to thereby calculate the center O11 of the wafer W. At this time, the center O11 calculated above has an error because the notch N is detected as the coordinate P11.

Figure 5A:
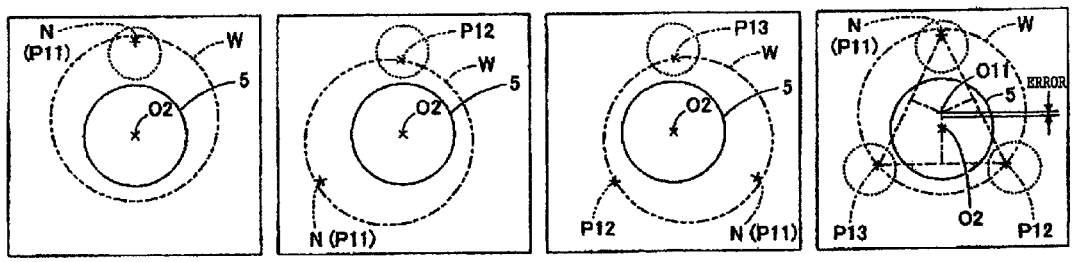
FIGS. 5A to 5C are plan views for illustrating a center calculating step as a modification of this preferred embodiment.
Figure 5B:
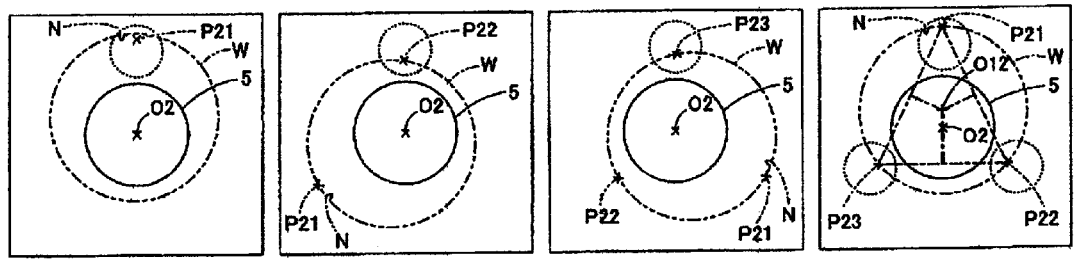

In the second calculation shown in FIG. 5B, the rotational position of the holding table 5 is shifted by a predetermined angle from the initial position in the first calculation shown in FIG. 5A. From this shifted rotational position, the holding table 5 is index-rotated at equal intervals. Accordingly, the imaging means 7 images other three points on the outer circumference of the wafer W different from the three points imaged in the first calculation. In this case, coordinates P21, P22, and P23 at the other three points on the outer circumference of the wafer W are detected from the images at the other three points. Thus, the coordinates different from the coordinates in the first calculation are detected, so that the notch N is not included as the coordinate on the outer circumference of the wafer W. Accordingly, the center O12 of the wafer W is accurately calculated. Since the center O11 calculated in the first calculation has an error, the center O11 does not coincide with the center O12 calculated in the second calculation. Accordingly, it is determined that the center of the wafer W has not been calculated at this time, and the third calculation is next performed.

Figure 5C:
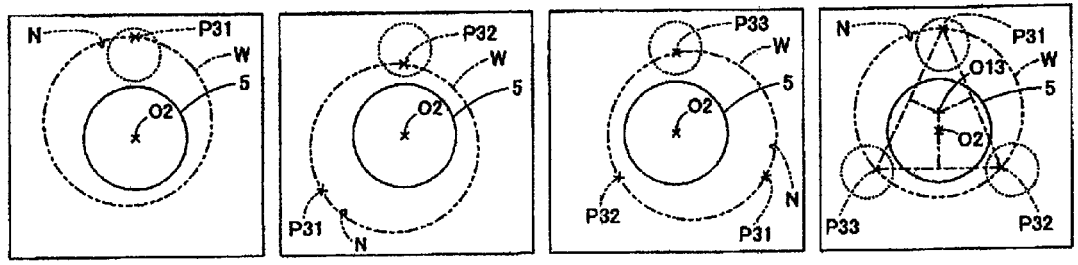

In the third calculation shown in FIG. 5C, the rotational position of the holding table 5 is further shifted by a predetermined angle from the initial position in the second calculation shown in FIG. 5B. From this shifted rotational position, the holding table 5 is index-rotated at equal intervals. Accordingly, the imaging means 7 images still other three points on the outer circumference of the wafer W different from all the points imaged in the first and second calculations. In this case, coordinates P31, P32, and P33 at the other three points on the outer circumference of the wafer W are detected from the images at the other three points. Thus, the coordinates different from the coordinates in the first calculation are detected, so that the notch N is not included as the coordinate on the outer circumference of the wafer W. Accordingly, the center O13 of the wafer W is accurately calculated. Since the center O13 calculated in the third calculation coincide with the center O12 calculated in the second calculation, it is determined that the center of the wafer W has been calculated.

Figure 6A:
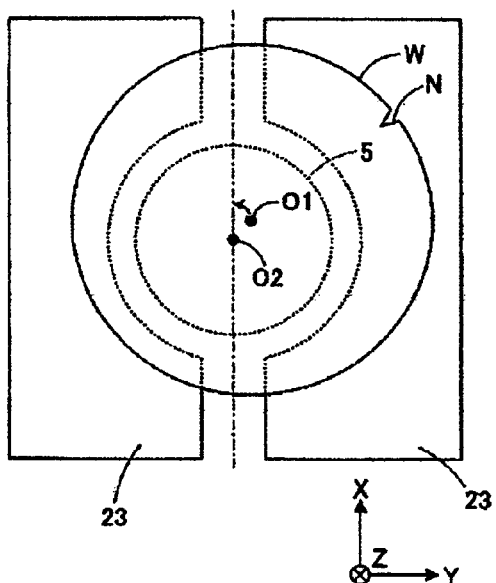
FIGS. 6A to 6E are views for illustrating a wafer centering step in this preferred embodiment.
Figure 6B:
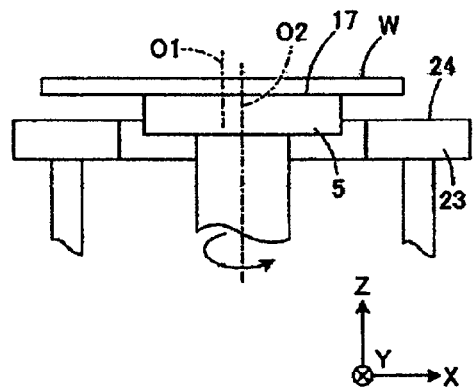

The wafer centering step according to this preferred embodiment will now be described with reference to FIGS. 6A to 6E. FIGS. 6A to 6E are views for illustrating the wafer centering step according to this preferred embodiment. After performing the center calculating step to calculate the center O1 of the wafer W, the wafer centering step shown in FIGS. 6A to 6E is performed. In the wafer centering step, the center O1 of the wafer W is initially deviated from the center O2 of the holding table 5 as shown in FIGS. 6A and 6B. In this condition, the upper surfaces 24 of the pair of mounting tables 23 are set at a position lower than the upper surface 17 of the holding table 5. That is, the wafer W held on the holding table 5 is spaced apart from the pair of mounting tables 23. Thereafter, the holding table 5 is rotated about the Z axis by a predetermined angle until the center O1 of the wafer W lies on the X axis passing through the center O2 of the holding table 5.

Figure 6C:
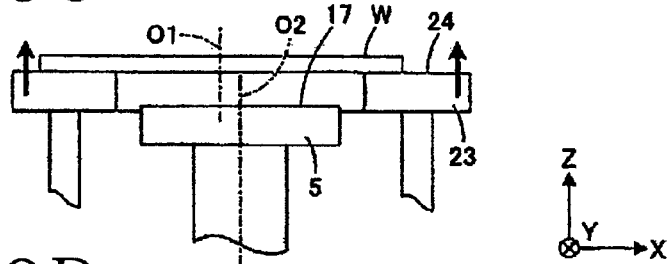
Figure 6D:
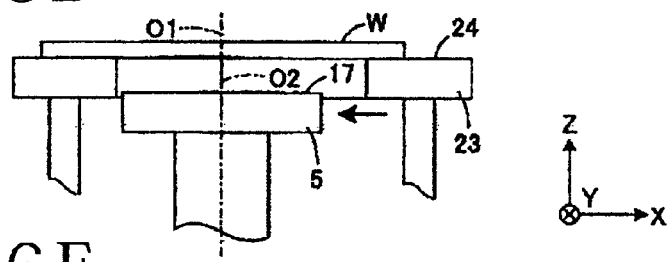

Thereafter, as shown in FIG. 6C, the mounting tables 23 are raised to set the upper surfaces 24 of the mounting tables 23 to a position higher than the upper surface 17 of the holding table 5. Accordingly, the wafer W is transferred from the holding table 5 to the mounting tables 23 and then placed on the mounting tables 23 (placing step). Thereafter, as shown in FIG. 6D, the holding table 5 is moved in the X direction by the amount of deviation of the center O1 of the wafer W from the center O2 of the holding table 5, thereby making the center O2 coincide with the center O1 (moving step).

Figure 6E:
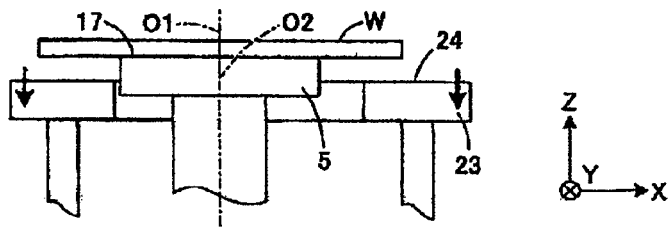

Thereafter, as shown in FIG. 6E, the mounting tables 23 are lowered to set the upper surfaces 24 of the mounting tables 23 to a position lower than the upper surface 17 of the holding table 5. Accordingly, the wafer W is transferred from the mounting tables 23 to the holding table 5 and then held on the holding table 5 under suction (suction holding step). In this manner, the center of the wafer W is made to coincide with the center of the holding table 5, thereby centering the wafer W.

In the mark detecting method according to this preferred embodiment described above, the holding table 5 is first index-rotated at a high speed to image at least three points on the outer circumference of the wafer W by using the imaging means 7, thereby obtaining the coordinates at the three points on the outer circumference of the wafer W. Thereafter, the center of the wafer W is calculated from the coordinates at the three points on the outer circumference of the wafer W. Thereafter, the wafer W is centered so that the center of the wafer W is made to coincide with the center of the holding table 5. By performing the centering of the wafer W, the fluctuations of the outer circumference of the wafer W in rotating the holding table 5 can be reduced, so that the imaging area by the imaging means 7 can be minimized in imaging the whole of the outer circumference of the wafer W to detect the notch N on the outer circumference of the wafer W. In this manner, the holding table 5 is index-rotated at a high speed in performing the centering of the wafer W, so that the centering of the wafer W can be performed in a short time. Further, since the imaging area in detecting the notch N on the outer circumference of the wafer W can be minimized, there is no possibility that the data volume may become excessively large even when the number of pixels is increased. Accordingly, the read time for the data can be reduced to thereby increase the rotational speed of the holding table 5, so that the notch N can be detected accurately in a short time.

The present invention is not limited to the above preferred embodiment, but various modifications may be made. The size and shape of the parts shown in the attached drawings are merely illustrative and they may be suitably modified within the scope where the effects of the present invention can be exhibited. Further, the above preferred embodiment may be suitably modified without departing from the scope of the object of the present invention.

For example, while the coordinate at the intersection between the linear imaging area A11 and the outer circumference of the wafer W is stored into the coordinate storing section 28 in the outer circumference coordinate storing step in the above preferred embodiment, the present invention is not limited to this configuration. That is, according to the present invention, the coordinate storing section 28 functions to store the coordinate at a specified position on the outer circumference of the wafer W in the image obtained by the imaging means 7. That is, the coordinate at any position on the outer circumference of the wafer W in the image obtained by the imaging means 7 may be stored into the coordinate storing section 28.

Further, while the center of the wafer W is calculated from the coordinates at the three points on the outer circumference of the wafer W in the center calculating step in the above preferred embodiment, the center of the wafer W may be calculated from the coordinates at four or more points on the outer circumference of the wafer W. Further, while the center of the wafer W is calculated from the intersection between the perpendicular bisector of the chords each obtained by connecting two of the three points on the outer circumference of the wafer W in the above preferred embodiment, the present invention is not limited to this configuration. That is, the center of the wafer W may be calculated from the intersection between the normals at the three points on the outer circumference of the wafer W.

Further, while the elevating means 22 is configured by a cylinder for vertically moving the mounting tables 23 relative to the holding table 5 in the above preferred embodiment, the present invention is not limited to this configuration. That is, according to the present invention, the elevating means 22 functions to relatively move the mounting tables 23 and the holding table 5 in a vertical direction. That is, the holding table 5 may be vertically moved relative to the mounting tables 23.

As described above, the present invention has an effect such that the mark for indicating the crystal orientation of the wafer can be detected accurately in a short time. In particular, the present invention is useful as a mark detecting method of detecting the mark of a large-size wafer having a diameter of 450 mm.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A mark detecting method for a wafer using a processing apparatus including
    a holding table having a suction holding surface for holding a central portion of a disk-shaped wafer under suction, said suction holding surface having an area smaller than that of said wafer, said wafer having a mark for indicating a crystal orientation on the outer circumference of said wafer,
    rotating means for rotating said holding table about its center as an axis of rotation at at least two speeds including a high speed and a low speed,
    an angle specifying section for specifying the rotational angle of said holding table to be rotated by said rotating means,
    an angle detecting section for detecting the rotational angle of said holding table rotated by said rotating means,
    imaging means for imaging the outer circumference of said wafer during the rotation of said holding table by said rotating means,
    a coordinate storing section for storing the coordinate at a specified position on the outer circumference of said wafer in an image obtained by said imaging means at the rotational angle detected by said angle detecting section, and
    suction holding position changing means for changing a suction holding position of said wafer to be held by suction on said holding table,
    said mark detecting method comprising:
    an outer circumference coordinate storing step of index-rotating said holding table at said high speed by operating said rotating means through the rotational angle specified by said angle specifying section, imaging at least three points on the outer circumference of said wafer by operating said imaging means, and storing the coordinates at said three points on the outer circumference of said wafer into said coordinate storing section;
    a center calculating step of calculating the center of said wafer by using the coordinates at said three points stored in said outer circumference coordinate storing step;
    a wafer centering step of making the center of said wafer calculated in said center calculating step coincide with the center of said holding table preliminarily stored, by using said suction holding position changing means; and
    a mark detecting step of continuously rotating said holding table holding under suction said wafer centered in said wafer centering step at said low speed by operating said rotating means, imaging the whole of the outer circumference of said wafer during the rotation of said holding table by using limited pixels in the image obtained by said imaging means along the outer circumference of said wafer, and detecting the rotational angle where said mark is located.

2. The mark detecting method according to claim 1, wherein said center calculating step includes
    a first calculating step of index-rotating said holding table through the rotational angle specified by said angle specifying section, imaging said three points on the outer circumference of said wafer by using said imaging means, and calculating the center of said wafer from the images obtained by said imaging means, a second calculating step of replacing at least one of the images obtained at said three points with another image and then calculating the center of said wafer from the images different in combination from those used in said first calculating step, and a determining step of comparing the center calculated in said first calculating step with the center calculated in said second calculating step and then determining that the center has been calculated if the two centers calculated coincide with each other, wherein said second calculating step is repeated until it is determined that the center has been calculated in said determining step, thus calculating the center of said wafer by using at least four images obtained by said imaging means.

3. The mark detecting method according to claim 1, wherein said suction holding position changing means includes a mounting table for mounting a peripheral portion of said wafer projecting outward from said suction holding surface of said holding table, elevating means for relatively moving said mounting table and said holding table in a vertical direction, and moving means for relatively moving said mounting table and said holding table in a horizontal direction, said wafer centering step using said suction holding position changing means includes a placing step of setting the upper surface of said mounting table to a position higher than the suction holding surface of said holding table by operating said elevating means, thereby placing said wafer on said mounting table, a moving step of moving said holding table by operating said moving means after performing said placing step, and a holding step of setting the upper surface of said mounting table to a position lower than the suction holding surface of said holding table by operating said elevating means after performing said moving step, thereby holding said wafer on said holding table under suction.

* * * * *